United States Patent [19]
Assaderaghi et al.

[11] Patent Number: 5,811,857
[45] Date of Patent: Sep. 22, 1998

[54] SILICON-ON-INSULATOR BODY-COUPLED GATED DIODE FOR ELECTROSTATIC DISCHARGE (ESD) AND ANALOG APPLICATIONS

[75] Inventors: Fariborz Assaderaghi, Jefferson Valley; Louis Lu-Chen Hsu, Fishkill; Jack A. Mandelman, Stormville; Ghavam G. Shahidi, Yorktown Heights, all of N.Y.; Steven H. Voldman, South Burlington, Vt.

[73] Assignee: International Business Machines Corporation, Armonk, N.Y.

[21] Appl. No.: 731,941

[22] Filed: Oct. 22, 1996

[51] Int. Cl.$^6$ .................................................. H01L 23/62
[52] U.S. Cl. .............................................. 257/355
[58] Field of Search ............................................. 257/355

[56] References Cited

U.S. PATENT DOCUMENTS

| | | |
|---|---|---|
| 4,115,709 | 9/1978 | Inoue et al. . |
| 4,408,245 | 10/1983 | Pryor . |
| 4,626,882 | 12/1986 | Cottrell et al. . |
| 4,889,829 | 12/1989 | Kawai . |
| 4,946,799 | 8/1990 | Blake et al. . |
| 4,989,057 | 1/1991 | Lu . |
| 5,023,692 | 6/1991 | Wodarczyk et al. . |
| 5,086,365 | 2/1992 | Lien . |
| 5,124,578 | 6/1992 | Worley et al. . |
| 5,144,390 | 9/1992 | Matloubia . |
| 5,159,518 | 10/1992 | Roy . |
| 5,204,988 | 4/1993 | Sakurai . |
| 5,382,818 | 1/1995 | Pein . |
| 5,401,996 | 3/1995 | Kelly . |
| 5,610,790 | 3/1997 | Staab et al. . |

OTHER PUBLICATIONS

IBM Technical Disclosure Bulletin vol. 14; No. 9; Feb. 1972/ Surface Controlled Semiconductor Arrangement/Dr. R. Remshardt and W. Scheerer.

*Primary Examiner*—Stephen Meier
*Attorney, Agent, or Firm*—Schmeiser, Olsen & Watts; Joseph P. Abate

[57] ABSTRACT

A body-coupled gated diode for silicon-on-insulator (SOI) technology is disclosed. The body-coupled gated diode is formed from an SOI field-effect transistor (FET). The body, gate and drain of the SOI FET are tied together, forming the first terminal of the diode. The source of the SOI FET forms the second terminal of the diode. Both NFETs and PFETs may be used to create the diode. An SOI circuit comprising at least one body-coupled gated diode formed from the SOI FET provides electrostatic discharge (ESD) protection and ideal diode characteristics.

29 Claims, 11 Drawing Sheets

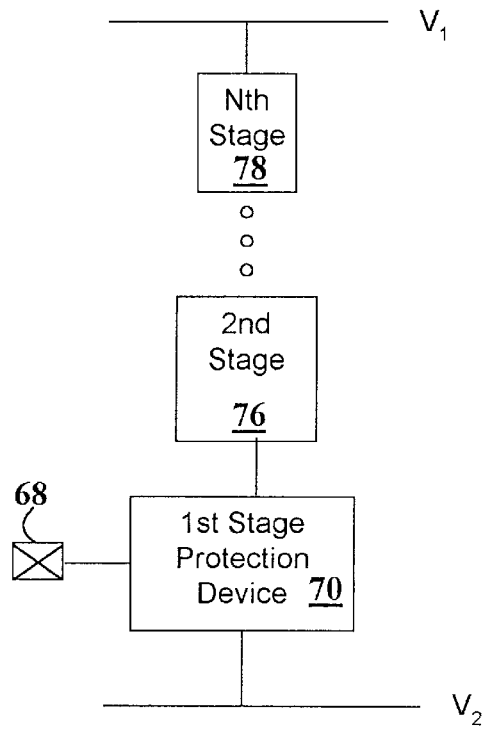
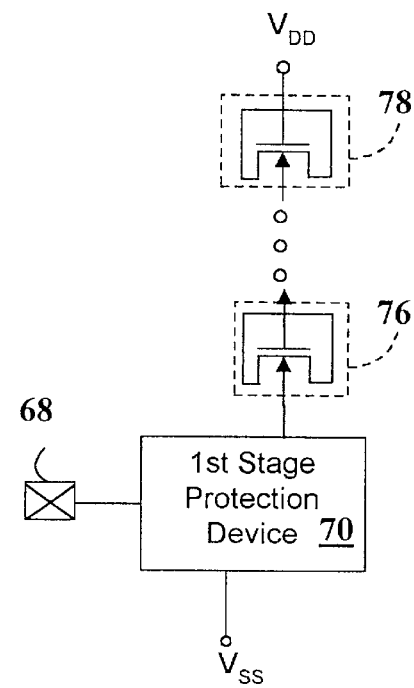
FIG. 15
FIG. 16
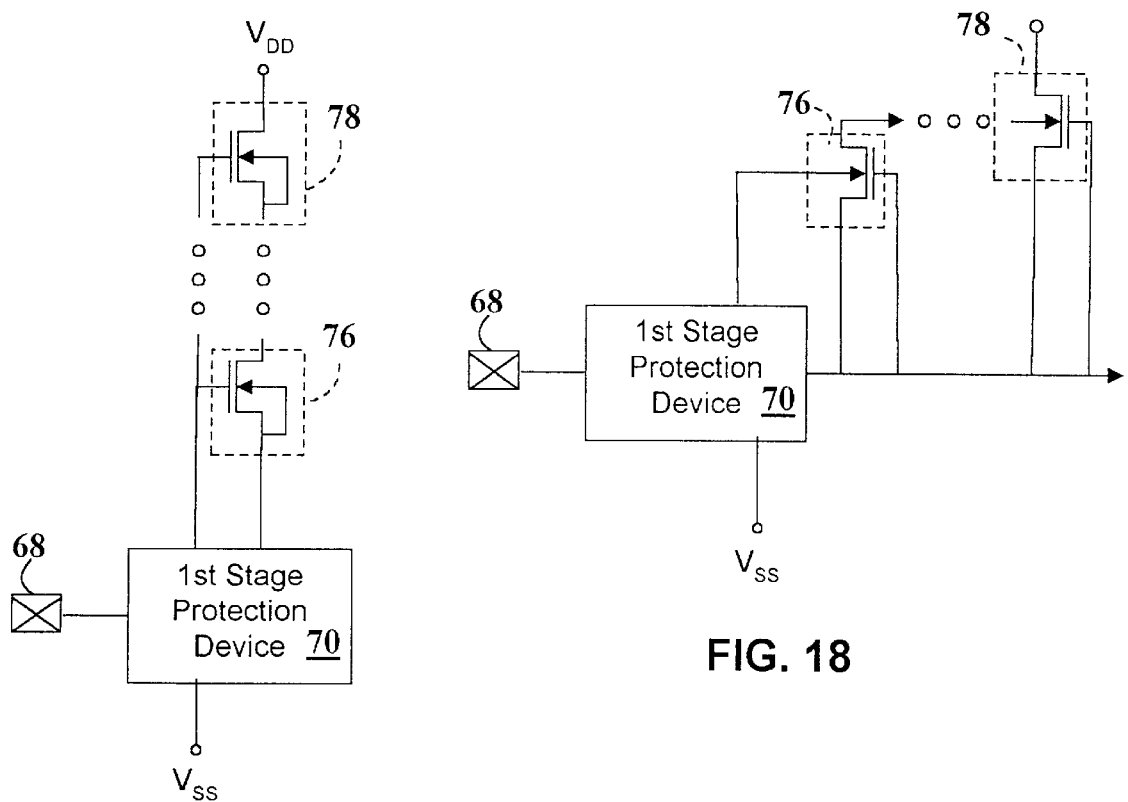
FIG. 17
FIG. 18

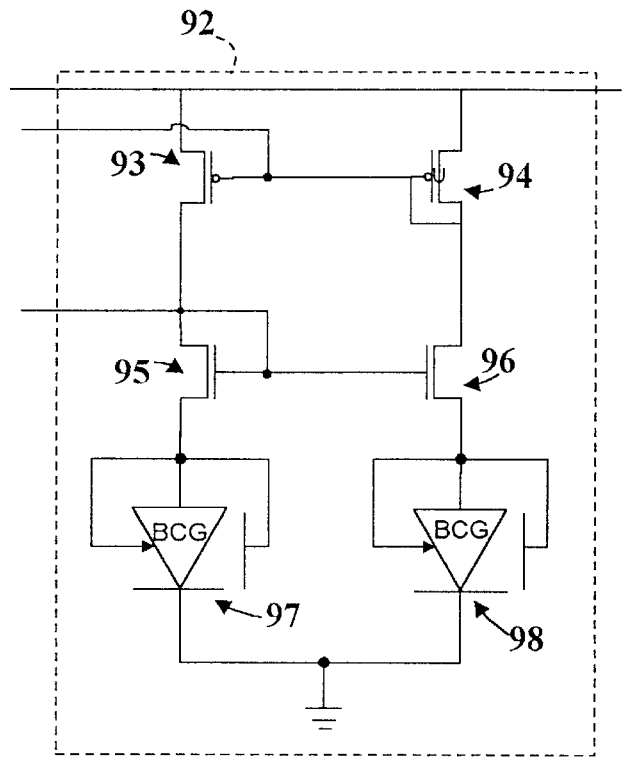
FIG. 26
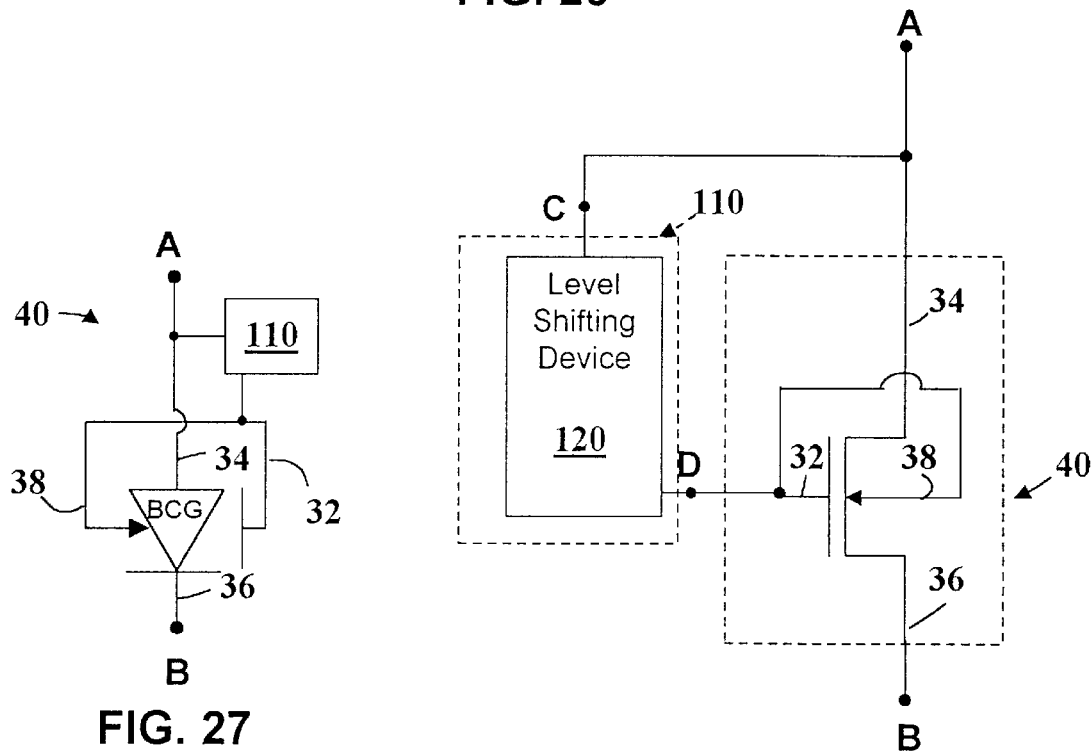
FIG. 27
FIG. 28

SILICON-ON-INSULATOR BODY-COUPLED GATED DIODE FOR ELECTROSTATIC DISCHARGE (ESD) AND ANALOG APPLICATIONS

BACKGROUND OF THE INVENTION

1. Technical Field

The invention relates generally to diodes, and more specifically, to silicon-on-insulator (SOI) diode circuits.

2. Background Art

Silicon-On-Insulator (SOI) technology, which is becoming of increasing importance in the field of integrated circuits, deals with the formation of transistors in a relatively thin layer of semiconductor material overlying a layer of insulating material. Devices formed on SOI offer many advantages over their bulk counterparts, including: higher performance, absence of latch-up, higher packing density, low voltage applications, etc. However, SOI circuits, like other electronic circuits, are: First, susceptible to electrostatic discharge (ESD), a surge in voltage (negative or positive) that occurs when a large amount of current is applied to the circuit; and second, in need of providing an ideality (a constant voltage swing of 60 mV/decade over several decades of current) for analog applications, such as in phase-locked-loop circuits, voltage regulators, and band gap reference circuits.

For ESD applications, to discharge ESD impulses, ESD protection schemes need a low voltage turn-on and a high current drive (the ability to generate or sink a large amount of current before a large amount of negative or positive voltage is developed). Traditional bulk overvoltage protection schemes, such as diode circuits, do not work well on SOI because of the presence of the SOI buried oxide. That is, conventional diodes on SOI have small current drivability because the current is carried laterally (limited by the thickness of the semiconductor material). Thus, developing a new approach or a new type of diode was necessary for adequate ESD protection for SOI circuits.

Some approaches for protecting SOI circuitry from ESD are found in the following U.S. Patents: U.S. Pat. No. 4,889,829 "Method for Producing a Semiconductor Device having a Silicon-On-Insulator Structure," issued December 1989 to Kawai; and U.S. Pat. No. 4,989,057, "ESD Protection for SOI Circuits," issued January 1991 to Lu. In the Kawai reference, ESD protection circuits, such as diodes, are made from a non-SOI substrate protect SOI circuits. A fundamental disadvantage with this approach is the circuit as disclosed in the Kawai reference creates a non-planar surface structure during fabrication, leading to many process related difficulties. For example, there would be difficulty in removing residual contaminant metal during the cleansing process, which would create large metal steps during metallization, leading to metal thinning and cracking. Thus, in general, manufacturing such a circuit would not be feasible.

The Lu reference discusses a gated diode, which could be used for ESD designs. The gated diode consists of a floating-body SOI transistor, with the gate connected to a signal pad. Although the diode disclosed in the Lu reference could provide some ESD protection, the diode does not allow for the desired trait of ideal characteristics, as discussed above. Some reasons preventing ideal diode characteristics with the diode in the Lu reference and with conventional diodes in general include: 1) alignment tolerances of the substrate cause large process-induced variations; and 2) the conventional diode structure may be a polysilicon diode, which receives extension and halo implants (implants normally utilized in deep submicron MOSFETs) that degrades the ideal diode characteristics on SOI. Thus, the diode in the Lu reference may be used for ESD protection, but is not appropriate for use with analog functions.

Accordingly, a need has developed in the art for an SOI diode that will not only provide ESD protection, but will provide diode ideality.

SUMMARY OF THE INVENTION

It is thus an advantage of the present invention to provide a diode for SOI technology with ESD protection.

It is also an advantage of the present invention to provide a diode for SOI technology with ideal diode characteristics.

The foregoing and other advantages of the invention are realized by a body-coupled gated diode formed from an SOI field-effect transistor (FET). The body, gate and drain of the SOI FET are tied together, forming the first terminal of the diode. The source of the SOI FET forms the second terminal of the diode. Both NFETs and PFETs may be used to create the forward-biased operation of the diode. An SOI circuit comprising at least one body-coupled gated diode formed from the SOI FET provides electrostatic discharge (ESD) protection and diode characteristics.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and:

FIG. 15 is a block diagram of a mixed voltage interface device using the ESD protection device of FIG. 9;

FIGS. 16, 17, and 18 are exemplary circuits for the mixed voltage interface device of FIG. 15;

FIG. 26 illustrates a block diagram of an analog device using the body-coupled gated diode of FIGS. 1 and 4;

FIG. 27 is a schematic of a body-coupled gated diode in accordance with a second embodiment of the present invention;

FIG. 28 illustrates a level-shifted body-coupled gated diode using the diode schematic of FIG. 27;

DETAILED DESCRIPTION OF THE DRAWINGS

Figure 1:
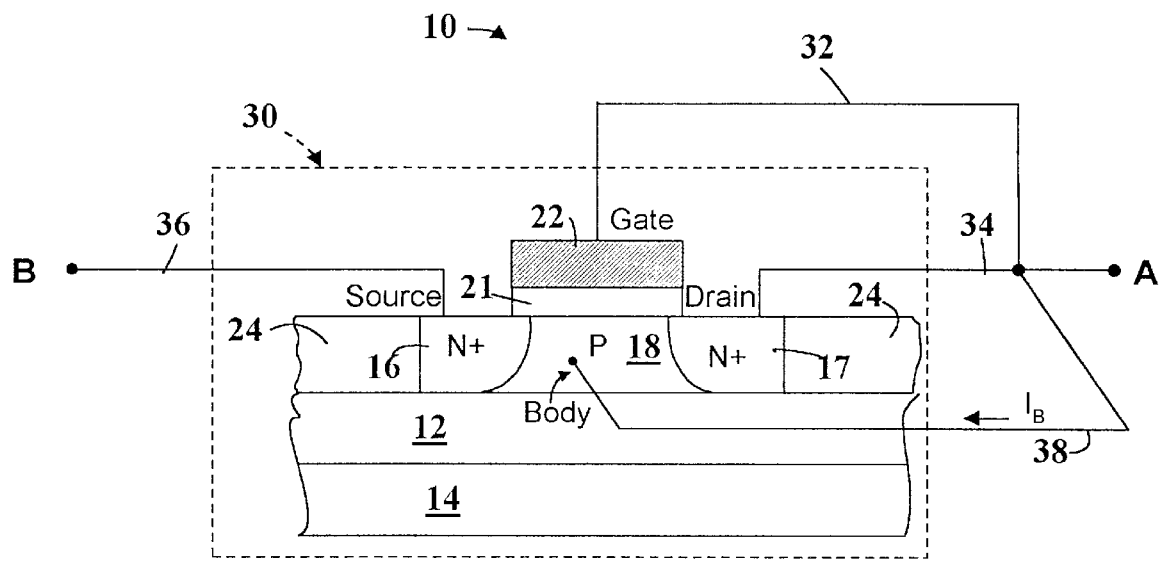
FIG. 1 is a cross-sectional view of the structure of an SOI n-channel field-effect transistor (NFET) of a body-coupled gated diode in accordance with a preferred embodiment of the present invention.

Referring to FIGS. 1–6, an NFET (FIGS. 1–3) and PFET (FIGS. 4–6) configuration of the body-coupled gated (BCG) diode in accordance with a preferred embodiment of the present invention are shown. As depicted in FIG. 1, an NFET BCG diode 10 is formed from an SOI MOSFET 30 having an isolation region 24, buried oxide 12, and silicon substrate 14. Two N+ regions are formed, a source region 16 and a drain region 17, on a P-type body region 18. Gate electrode 22 overlies gate insulator 21 and defines the gate of the MOSFET 30. Surface channel 23 lies below gate insulator 21 and on the surface of the P-type region 18, wherein the P-type region is also known as the channel. The source 36, drain 34, body 38 and gate 32 terminals are affixed to the source region 16, drain region 17, body node region 18 and gate electrode 22, respectively. Terminal A, coupled to the body 38, drain 34, and gate 32 terminals, and terminal B, coupled to the source terminal 36, form the input and output of an N+/P type BCG diode 10. Although not shown, the connections of the terminals can be easily done at any of the metal layers of MOSFET 30.

Figure 2:
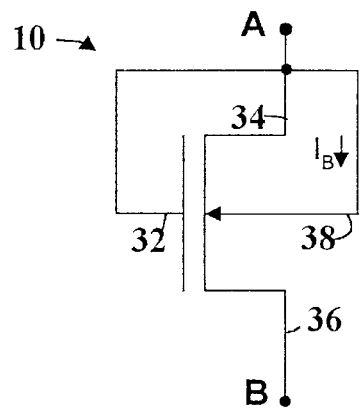
FIG. 2 is the circuit schematic of the body-coupled gated diode of FIG. 1.
Figure 3:
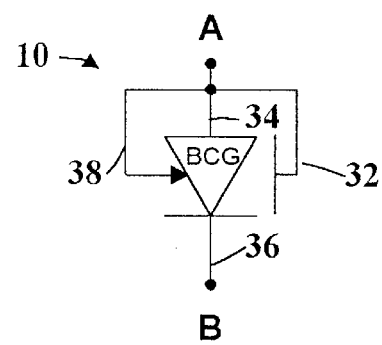
FIG. 3 is a symbol representing the circuit schematic of FIG. 2.

FIG. 2 illustrates the circuit schematic of NFET BCG diode 10. As in FIG. 1, FIG. 2 shows BCG diode 10 comprising a source 36, drain 34, body 38, and gate 32 terminals. BCG diode 10 comprises two terminals, A and B. As aforementioned, terminal B is coupled to the source terminal 36, and terminal A is coupled to the body 38, gate 32 and drain 34 terminals being tied together. When terminal A is greater in voltage than terminal B, the BCG diode 10 will turn on, thus providing ESD protection as discussed in greater detail below. BCG diode 10 of FIG. 2 is represented by the diode symbol 10 as shown in FIG. 3.

Figure 4:
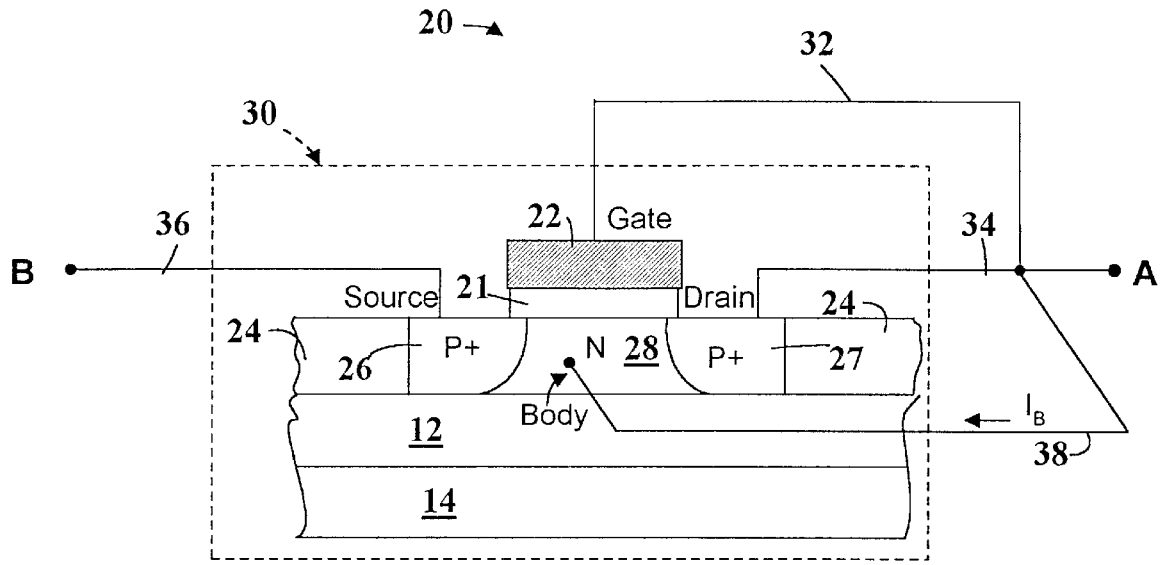
FIG. 4 is a cross-sectional view of the structure of an SOI p-channel field-effect transistor (PFET) of a body-coupled gated diode in accordance with a preferred embodiment of the present invention.

Similarly, as shown in FIG. 4, a PFET BCG diode 20 is formed from an SOI MOSFET 30 having an isolation region 24, buried oxide 12, and silicon substrate 14. Two P+ regions are formed, a source region 26 and a drain region 27, on the N-type body region 28. As aforementioned, gate electrode 22 overlies gate insulator 21 and defines the gate of the MOSFET. The source 36, drain 34, body 38 and gate 32 terminals are affixed to the source region 26, drain region 27, body node region 28 and gate electrode 22, respectively. Terminal A, coupled to the body 38, drain 34, and gate 32 terminals, and terminal B, coupled to the source terminal 36, form the input and the output of a P+/N type BCG diode 20.

Figure 5:
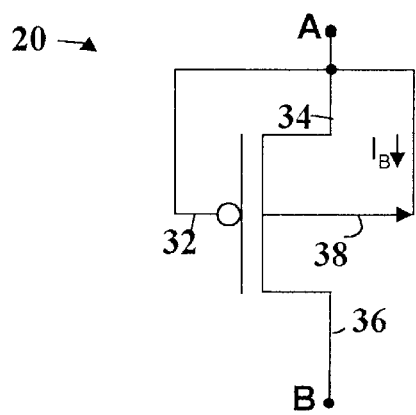
FIG. 5 is the circuit schematic of the body-coupled gated diode of FIG. 4.
Figure 6:
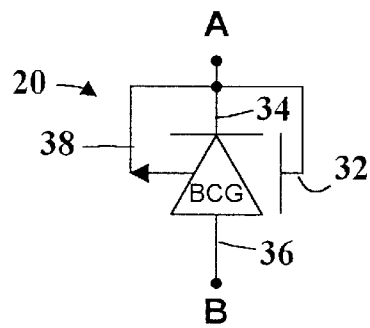
FIG. 6 is the symbol representing the circuit schematic of FIG. 5.

FIG. 5 illustrates the circuit schematic of PFET BCG diode 20. As in FIG. 4, FIG. 5 shows BCG diode 20 comprising a source 36, drain 34, body 38, and gate 32 terminals. BCG diode 20 comprises two terminals, A and B. As aforementioned, terminal B is coupled to the source terminal 36, and terminal A is coupled to the body 38, gate 32 and drain 34 being tied together. When terminal B is greater in voltage than terminal A, the BCG diode 20 will turn on, the operation being discussed in greater detail below. BCG diode 20 of FIG. 5 is represented by the diode symbol 20 as shown in FIG. 6. Since the present invention comprises both polarities of diode transistors (N+/P and P+/N), a greater flexibility in circuit operation and design is available for SOI technology, as will be seen below.

Figure 7:
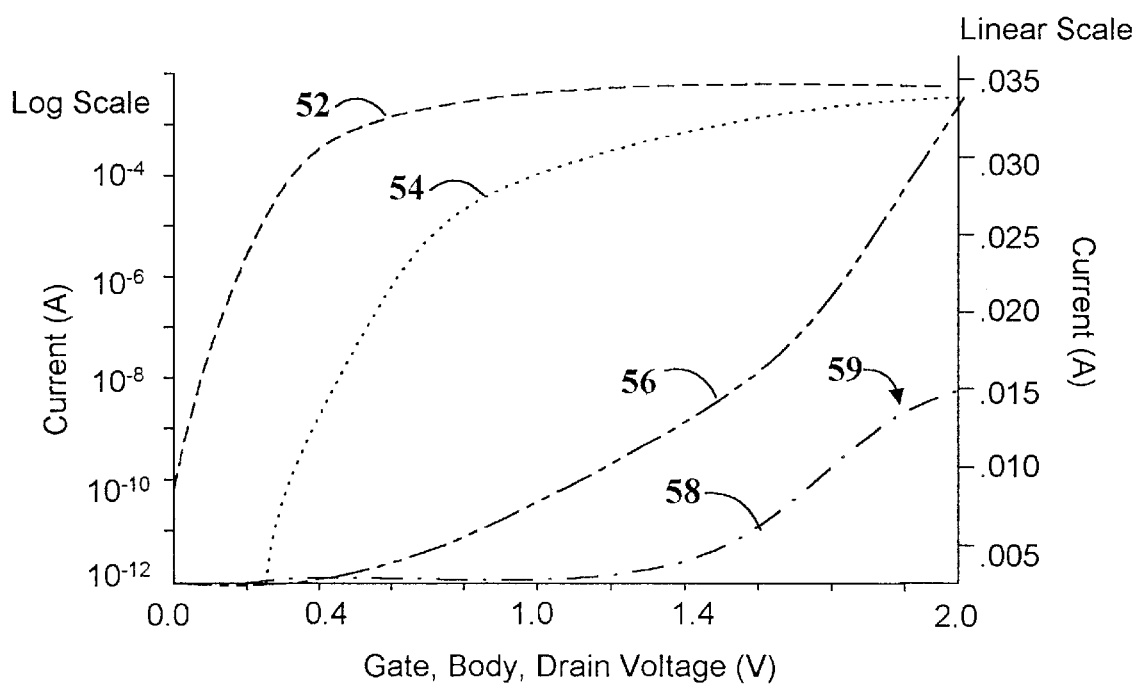
FIG. 7 is graph of measured characteristics of the gate/body/drain voltage vs. the current of FIG. 1.

The operation of the MOSFET BCG diode shown in FIGS. 1–6 takes place in two current regions, which will be illustrated in greater detail in reference to FIG. 7. In the first current region, the BCG diode provides ideal diode characteristics. In the second current region the BCG diode provides ESD protection. In general, the first current region of the BCG diode corresponds to the functional voltage range from approximately 0 volts to approximately Vdd, wherein Vdd is the power supply voltage. The exponential portion of diode characteristics, though, is typically limited to zero to approximately +/−0.7 volts because of external and parasitic series resistances. The second current region of the BCG diode corresponds to the range approximately below zero and above the power supply voltage, Vdd.

For the second current region, ESD protection is provided under two turn-on conditions of the MOSFET BCG diode. The first turn-on condition occurs when the voltage of the body 38 exceeds the voltage of the source 36. When this condition occurs, a forward-biased diode attribute allows a current flow from the body terminal to the source terminal. The first condition is given by the equation:

$$|V_{pad} = V_{body}| > |V_{be} + V^*|$$

wherein, $V_{pad}$=applied voltage (voltage of a signal pad);

$V_{body}$=body voltage;

$V_{be}$=diode forward-biased voltage between body and source terminals; and $V^*$=Vdd when MOSFET BCG diode is an NFET, or Vss when MOSFET BCG diode is a PFET.

The second turn-on condition occurs when the voltage at the gate 32 exceeds the threshold voltage. That is, as the signal pad voltage increases, the body voltage and the gate voltage will also increase. When the body voltage increases, the threshold voltage decreases. Thus, when the gate voltage exceeds the threshold voltage, current will flow from the drain terminal to the source terminal. This condition is given by the equation:

$$|V_{pad} = V_{gate}| > Vt_{(Vbody-Vpad)} + V^*|$$

wherein, $V_{pad}$=applied voltage;

$V_{gate}$=gate voltage;

$Vt_{(Vbody = Vpad)}$=the threshold voltage when the voltage of the body is equal to the voltage of the applied voltage; and $V^*$=Vdd when MOSFET BCG diode is an NFET, or Vss when MOSFET BCG diode is a PFET.

Thus, for the NFET BCG diode 10 (FIG. 1), when a positive pulse is applied to the terminal of the NFET (terminal A), the current is discharged through the P-N diode formed by the body 18 and drain 16 of the NFET structure. In parallel, as the body voltage increases, the threshold voltage of the MOSFET 30 decreases, creating a dynamic threshold and ideal diode characteristics. As the threshold voltage of the NFET decreases, the gate-coupling of the NFET turns on the NFET in parallel with the diode. A unique aspect of the BCG diode is the parallel operation of diodic characteristic of the diode and the body and gate coupled MOSFET interaction. The BCG diode uses body-coupling to lower the absolute value of the threshold voltage and gate-coupling to turn on the ESD MOSFET element prior to NFET snapback.

Likewise, for the PFET BCG diode 20 (FIG. 4), when a negative pulse is applied to the terminal of the PFET (terminal A), the current is discharged through the N-P diode formed by the body 28 and drain 26 of the PFET structure. In parallel, as the body voltage decreases, the magnitude of the threshold voltage of the PFET 20 decreases, again creating a dynamic threshold and ideal diode characteristics. As the threshold voltage of the PFET decreases, the gate-coupling of the PFET turns on the PFET in parallel with the diode. As aforementioned, a distinguishing aspect of the BCG diode as compared to other diodes is the parallel operation of diodic characteristic of the diode and the body and gate coupled MOSFET interaction. That is, the BCG diode uses body-coupling to lower the absolute value of the threshold voltage and gate-coupling to turn on the ESD MOSFET element prior to PFET snapback.

FIG. 7 illustrates the operation of the NMOSFET BCG diode 10 (FIG. 1) of the present invention (lines 52 and 56) compared to the operation of a non-BCG diode (lines 54 and 58). On the left vertical axis of the graph is a log scale of the current at the first current region (pertaining to lines 52 and 54), indicating the subthreshold regions of MOSFET 30 (line 52) and the FET of the non-BCG diode (line 54). The other vertical axis of the graph illustrates the linear scale of the current at the second current region (pertaining to lines 56 and 58), indicating the ESD operational mode of MOSFET 30 (line 56) and the FET of the non-BCG diode (line 58). At the first current region, the BCG diode (line 52), unlike the non-BCG diode (line 54), attains an ideal subthreshold swing of 60 mV/decade. This ideality is possible through the coupling of the body to the gate of MOSFET 30. That is, the gate voltage is directly applied to the body instead of being capacitively coupled, as with the conventional non-BCG diode. The ideality factor n is given by the equation:

$$n=1+C_D/C_{OX}$$

wherein $C_D/C_{OX}$=the capacitive coupling.

Thus, the value of the ideality factor (n) is approximately 1 for the BCG diode, whereas n is greater than 1 for the non-BCG diode. The ideality factor is important to the resulting slope, which is found through the equation:

$$I=I_0(e^{V/nkT/q}-1)$$

wherein I=the resulting current;
 $I_0$=the reverse saturation current;
 V=the voltage of the diode;
 n=the ideality factor;
 k=the Boltzman constant;
 T=the absolute temperature (°K.); and
 q=the electron charge.

The elements kT/q are approximately equal to 26 mV, and the current is proportional to e. The slope can then be approximated by multiplying 60 mV/decade (kT/q*ln(10)) by the ideality factor. The BCG diode, with an ideality factor of 1, produces a 60 mV/decade slope (line 52), and the non-BCG diode, with an ideality factor of approximately 1.45, produces a slope of around 87 mV/decade (line 54). As aforementioned, a 60 mV/decade slope is important in analog applications for functions such as voltage reference, phase-locked-loop, and voltage regulators.

At the second current region (lines 56 and 58), the ESD protection provided by the non-BCG diode (line 58) is minimal, quickly being dominated by series resistance 59, where the voltage begins to increment proportionally to the current. The ESD protection provided by the BCG diode is much greater (line 56). The BCG MOSFET at this point may be conceptually treated as a bipolar device with large (and sometimes infinite) current gain. The drain current can be modeled as the collector current, and the body (gate) current as the base current. Even though for ease of analysis this device may be treated as a bipolar device, it is indeed a MOSFET since the current conduction is through the surface channel and is controlled by the gate. The "apparent" gain of the "bipolar" device is large, because the threshold voltage (Vt) of the MOSFET is being modulated by the applied bias to the silicon film. This gives the appearance of large bipolar gain at low biases.

Figure 8:
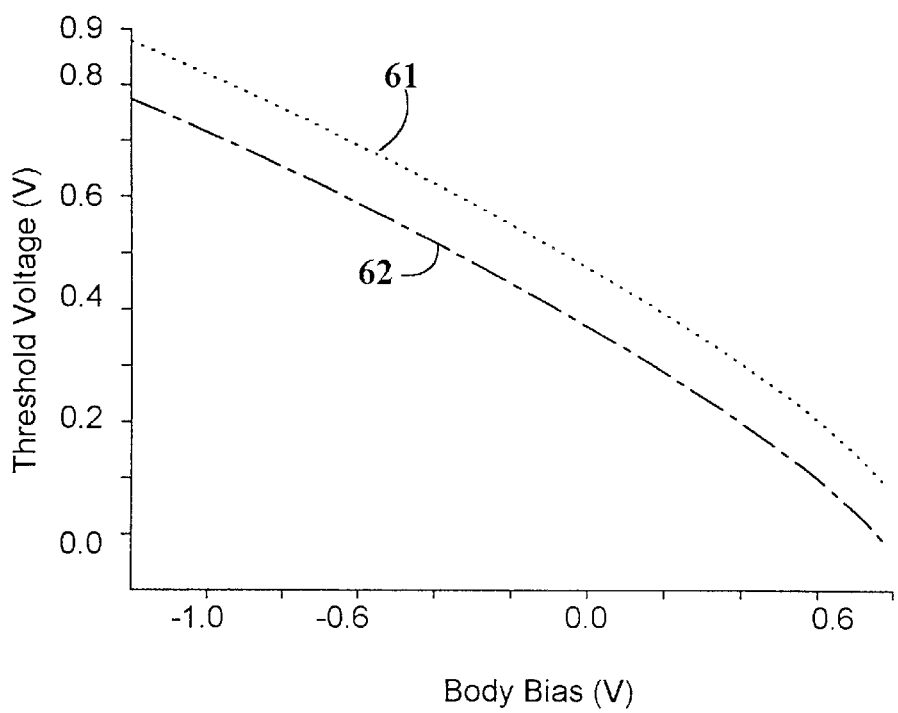
FIG. 8 is a graph of measured characteristics of the threshold voltage vs. body bias of FIG. 1.

FIG. 8 demonstrates the modulation of the threshold voltage by the applied body bias. The modulation of two devices are depicted, one being of a shorter channel length than the other. Line 61 illustrates when $L_{drawn}$, the drawn dimensions of the channel length, is equal to 0.25 μm, and line 62 illustrates when $L_{drawn}$ is equal to 0.20 μm. Thus, the BCG diode uses body-coupling to lower the absolute value of the threshold voltage and create a dynamic threshold. Consequently, control of the threshold voltage allows for excellent control of the diode characteristics. Furthermore, by changing Vt-adjust implants (implants that are utilized to control the threshold voltage) of a MOSFET, the $I_0$ of the BCG diode (e.g., Ioff of the MOSFET) can easily be changed by several orders of magnitude. This change is depicted by moving line 52 to the left or right, which is not easily accomplished in regular diodes.

Carrying the bipolar analogy one step further, it becomes clear why connecting the collector and base together will form a diode. Here, the gate and the body may form the base terminal, the drain may be the collector terminal, and the source may be the emitter terminal. Even though the base (gate) current might have non-ideality, its sum with the collector current will remain ideal because the collector current is several orders of magnitude larger than the base current. As seen, this diode will have a much larger current than the conventional diode of the same size.

FIGS. 9–25 illustrate using the BCG diode as described above in a variety of ESD applications and circuits in accordance with an embodiment of the present invention.

Figure 9:
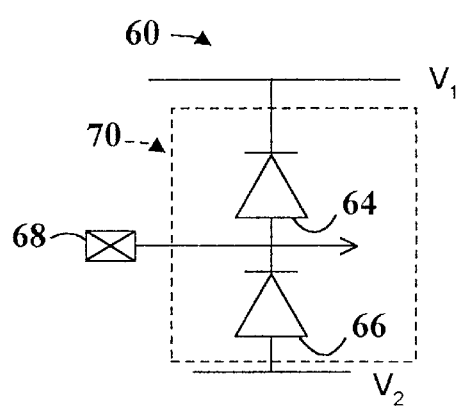
FIG. 9 illustrates a block diagram of an ESD protection device using body-coupled gated diode of FIGS. 1 and/or 4.

As shown in FIG. 9, a block diagram of a first stage ESD protection device 70 comprises diodes 64 and 66, at least one of them being a BCG diode. Diode 64 is coupled to a signal pad 68 and a predetermined high voltage $V_1$. Diode 64 will sink an excessive amount of current from signal pad 68, thus clamping the voltage from the signal pad 68 to the predetermined high voltage $V_1$ when the signal voltage is greater than $V_1$. Diode 66 is coupled to the signal pad 68 and a predetermined low voltage $V_2$. Diode 66 clamps the signal voltage to the predetermined low voltage $V_2$ by the driving more current to the device when the signal voltage is below the low voltage $V_2$.

Figure 10:
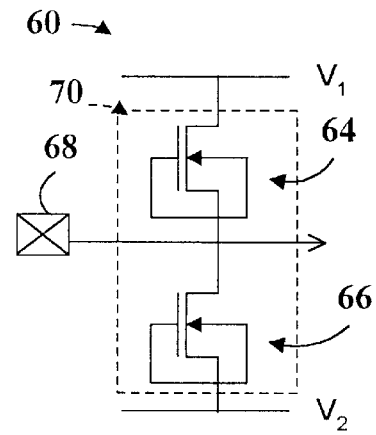
FIGS. 10, 11, 12 and 13 illustrate exemplary circuits for the device of FIG. 9.
Figure 11:
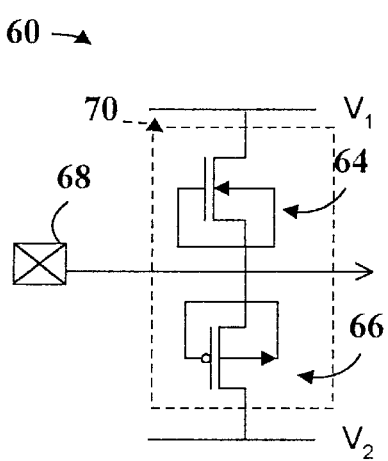
Figure 12:
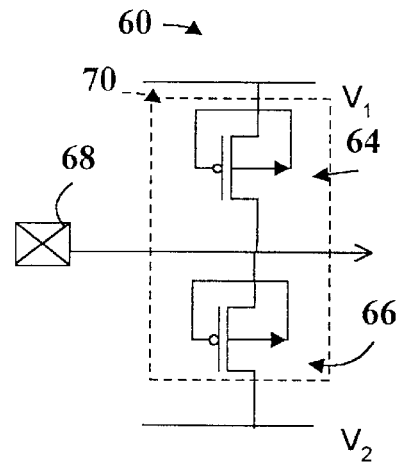
Figure 13:
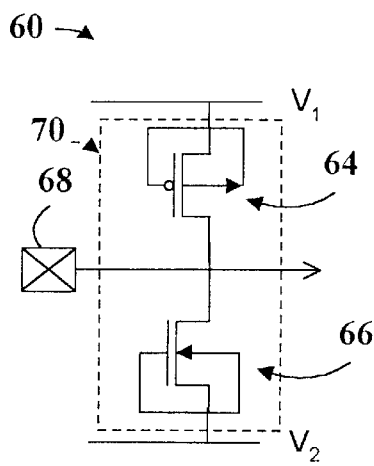

FIGS. 10–13 illustrate using the NFET (N+/P) and PFET (P+/N) configurations of the preferred embodiment of the BCG diode for diodes 64 and 66. As seen in FIG. 10, two N+/P diodes are used for diodes 64 and 66. In FIG. 11, diode 64 is an N+/P diode and diode 66 is an P+/N diode. In FIG. 12, diodes 64 and 66 are P+/N diodes. In FIG. 13, diode 64 is a P+/N diode and diode 66 is a N+/P diode. As aforementioned, and as can be seen through these four exemplary circuits, there is flexibility in creating the circuit when both N+/P and P+/N diodes may be used.

Figure 14:
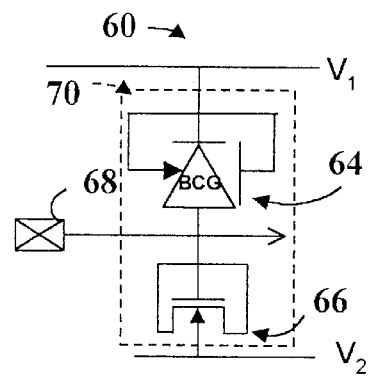
FIG. 14 is another exemplary circuit of the ESD protection device of FIG. 9.

As seen in FIG. 14, a BCG diode may be used in combination with other non-BCG diodes in forming the ESD protection circuit of FIG. 9. One example is a BCG diode 64 used in conjunction with a diode having its source, drain and gate tied together 66. It is to be understood that the ESD protection device of the present invention is not limited by the combinations shown as examples. Other appropriate combinations, such as a gated diode and a BCG diode may also be used.

As shown in FIG. 15, other stages 76, 78 may be added onto the first stage ESD protection device 70 when mixed voltage interfacing is involved. The first stage ESD protection device 70, as described above with reference to FIG. 9, is connected to signal pad 68, $V_2$, and subsequent stages. Each stage adds approximately an additional 0.7 volts onto the first stage, allowing for a delay in the turn on of the first stage protection device 70. Although specific examples and elements will be discussed in reference to the following figures, it is to be understood that the various stages of the ESD protection device of the present invention are not limited thereby. Other appropriate elements and combination of elements, such as gated diodes, lubistors, any appropriate MOSFETs or dynamic threshold transistors, may also be used.

FIGS. 16–18 depict three exemplary elements used for the various stages 76, 78. As seen in FIG. 16, each stage 76, 78, etc. may comprise a diode having its source, drain and gate tied together. The body of diode 76 is connected to the first stage protection device 70 and the gate of the diode 76 is connected to Vdd and to the body of the next diode. The body of the Nth stage diode 78 is connected to the prior stage diode and the gate is connected to Vdd. In FIG. 17, each stage of diode 76, 78, etc. comprises a transistor with its body and drain tied together. The gate of diode 76 is coupled to the gates of the other stages of diodes 78 including the gates of the diodes in the 1st stage protection device 70 (not shown). The drain of diode 76 is connected to protection device 70 and its source is connected to the drain of the next diode. The source of the Nth stage diode 78 is connected to Vdd.

FIG. 18 shows a series of diodes 76, 78 wherein the gates and the drains are all tied together with the first stage protection device 70. The body of the second stage diode 76 is connected to the protection device 70 and the source of the second stage diode 76 is connected to the body of the third stage diode, etc. The source of the Nth stage diode 78 is connected to Vdd.

Figure 19:
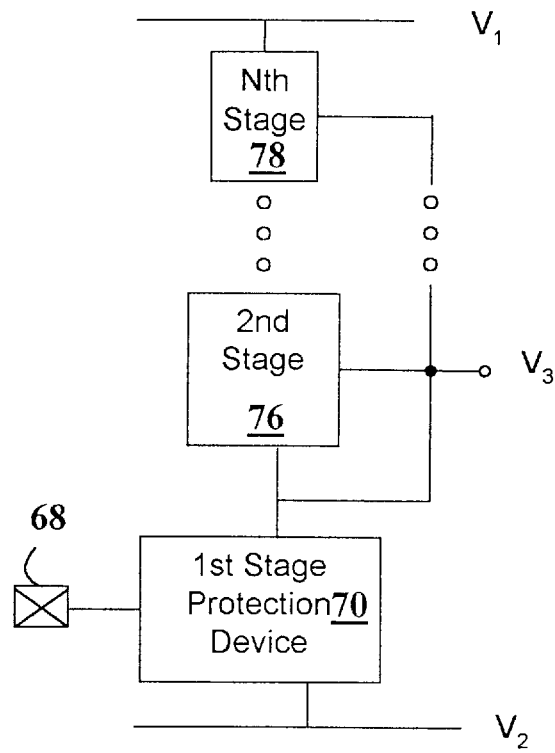
FIG. 19 is a block diagram of a mixed voltage interface device using the ESD protection device of FIG. 9 having two power supplies.
Figure 20:
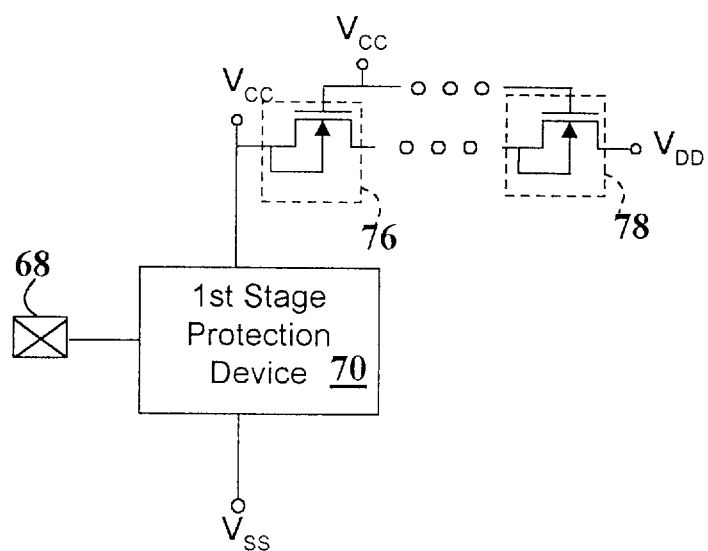
FIGS. 20, 21, and 22 are exemplary circuits for the mixed voltage interface device of FIG. 19.
Figure 21:
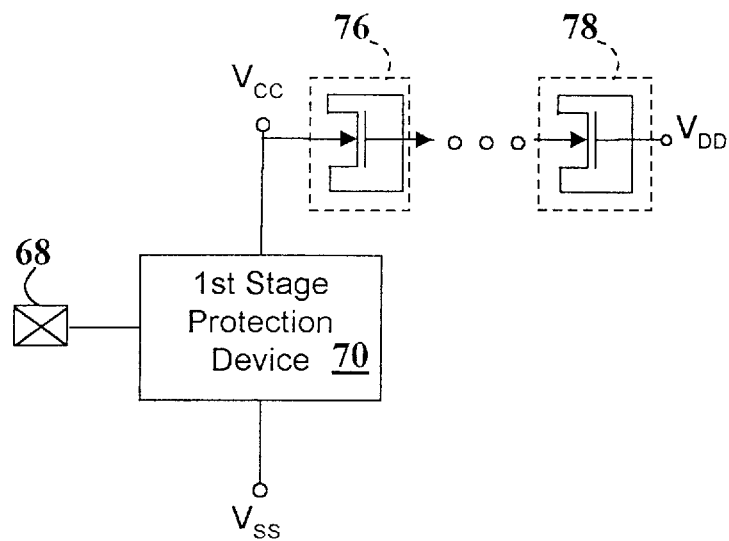
Figure 22:
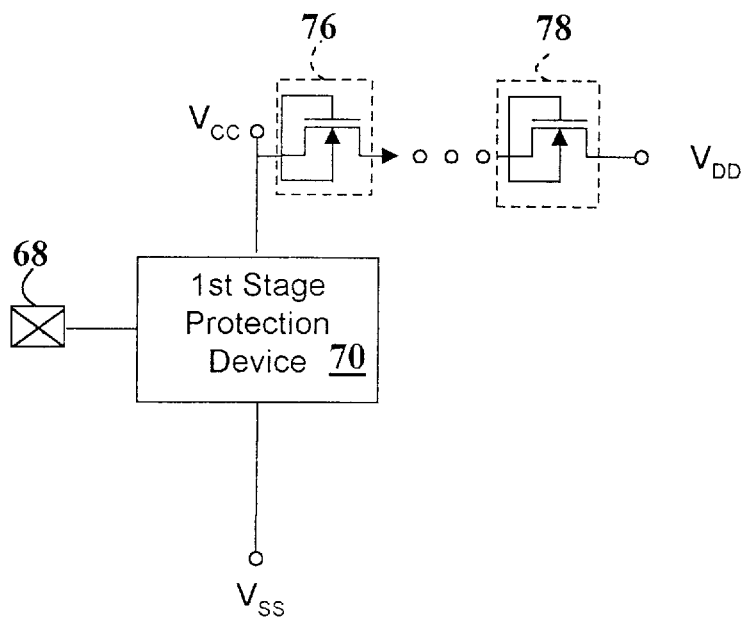

As shown in FIG. 19, a second power supply $V_3$ may also be used with the mixed voltage interfacing device of FIG. 15. Again, the first stage ESD protection device 70 is connected to signal pad 68, $V_2$, and subsequent stages. FIGS. 20–22 show specific examples for FIG. 19. In FIG. 20, each stage of diode 76, 78, etc. comprises a transistor with its body and drain tied together. The gate of diode 76 is connected to the gates of the other stages of diodes 78 and Vcc. The drain of diode 76 is connected to Vcc and protection device 70 and its source is connected to the drain of the next diode. The source of the Nth stage diode 78 is connected to Vdd.

As seen in FIG. 21, each stage of diode 76, 78, etc. comprises a diode having its source, drain and gate tied together. The body of diode 76 is connected to Vcc and the first stage protection device 70 and the gate of diode 76 is connected to Vdd and to the body of the next diode. The body of the Nth stage diode 78 is connected to the prior stage diode and its gate is connected to Vdd. As seen in FIG. 22, each diode stage 76, 78, etc. comprises a BCG diode with its drain connected to the body and gate. The drain of diode 76 is connected to Vcc and protection device 70 and its source is connected to the drain of the next diode. The source of the Nth stage diode 78 is connected to Vdd.

Figure 23:
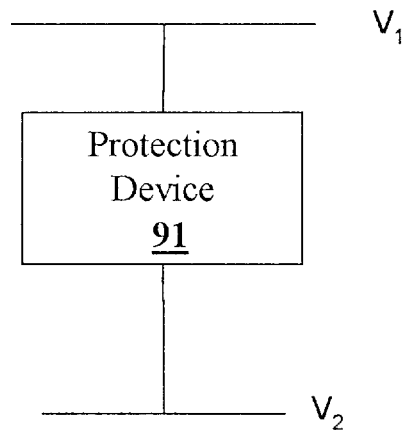
FIG. 23 is a block diagram of a voltage interface device having at least one body-coupled gate diode of FIGS. 1 and 4 used between two voltages.
Figure 24:
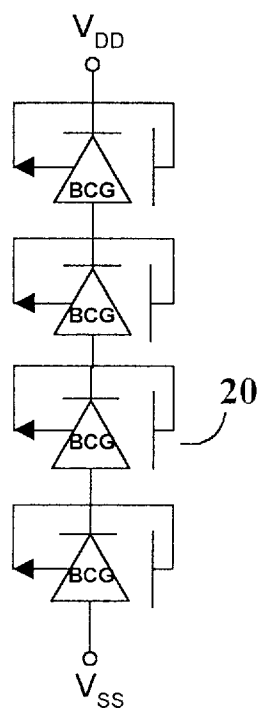
FIGS. 24 and 25 are exemplary circuits for the device of FIG. 23.
Figure 25:
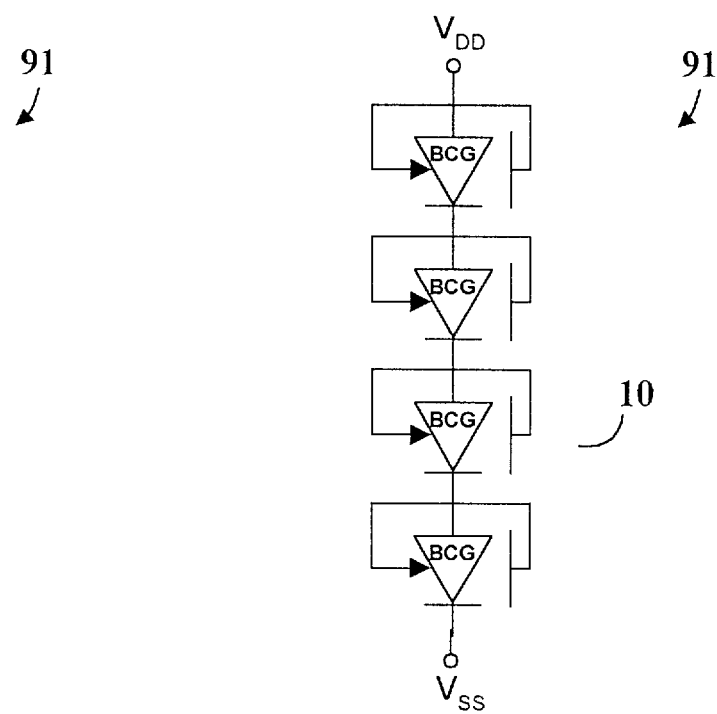

FIG. 23 illustrates an ESD protection device 91 that may be used between two power supplies, $V_1$ and $V_2$. The protection device 91 generally comprises a string of diodes, at least one being a BCG diode, wherein the string of diodes contains a set of diodes electrically coupled in a serial fashion, anode to cathode. The string of diodes may contain diodes such as lubistors, gated diodes, and other dynamic threshold (DT) MOSFETs, etc. FIGS. 24 and 25 illustrate specific implementations of FIG. 23. In FIG. 24, device 91 comprises a string of PFET BCG diodes 20. As seen in FIG. 25, device 91 comprises a string of NFET BCG diodes 10.

FIG. 26 shows the BCG diode of the present invention used in conjunction with a typical analog application. Circuit 92 is a section of a band-gap reference circuit that is used in charge pumps and phase-locked loops. Circuit 92 comprises two PFETs 93 and 94 tied together at the gates, and two NFETs 95 and 96 tied together at the gates. The drain of PFET 93 is connected to the drain and gate of NFET 95. The drain and gate of PFET 94 is connected to the drain of NFET 96. The first terminal of BCG diode 97 is connected to the source of NFET 95, and the first terminal of BCG diode 98 is connected to the source of NFET 97. The second terminal of BCG diodes 97 and 98 are tied to ground. Typically, the width of BCG diode 98 is "m" times greater than the width of BCG diode 97. Hence, since both diodes are drawing the same current, the smaller diode (in this case, diode 97) will develop a larger voltage to drawn current ratio. The resulting voltage is given by the equation:

$$V_A - V_B = kT/q * ln(m)$$

wherein $V_A$=the voltage of the smaller diode;
$V_B$=the voltage of the larger diode;
kT/q=the terminal voltage (described in reference to FIG. 7, approximately 26 mV); and
m=the ratio of the width of the larger diode to the width of the smaller diode.

For example, if m is equal to 10, then the resulting fixed voltage that is supplied to the circuit ($V_A - V_B$) would be approximately 60 mV. Although m is equal to 10 in this example, it is to be understood that other appropriate values may be used. The BCG diodes 97 and 98 provide the ideality necessary for a fixed voltage, which allows the band-gap reference circuit to function correctly.

FIG. 27 illustrates a second embodiment of the BCG diode 40 in accordance with the present invention. As with the first embodiment, the gate 32 and the body 38 are tied together. The source 36 forms terminal B, and the drain 34 forms terminal A. The diode shown is in NFET configuration, but may also be made in PFET configuration. The drain 34 is indirectly connected to the body 32 and gate 38 through delay device 110 as shown in subsequent figures. Thus, the operation of diode 40 is similar to the operation as described in reference to FIGS. 1–6.

Figure 29:
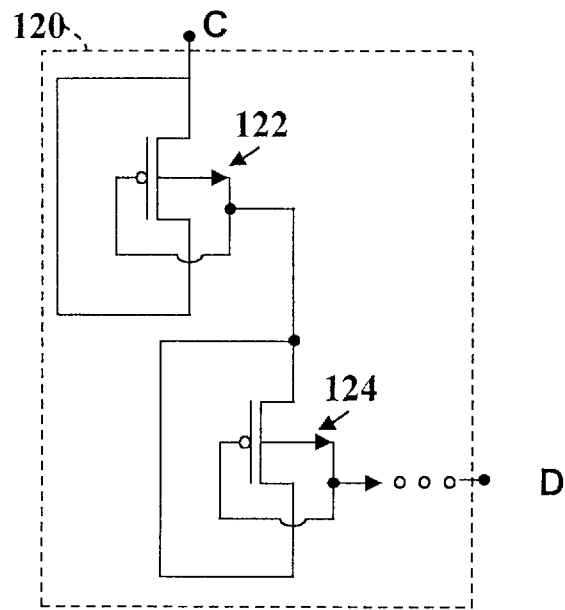
FIGS. 29 and 30 illustrate two exemplary circuits of the level shifting device of FIG. 28.
Figure 30:
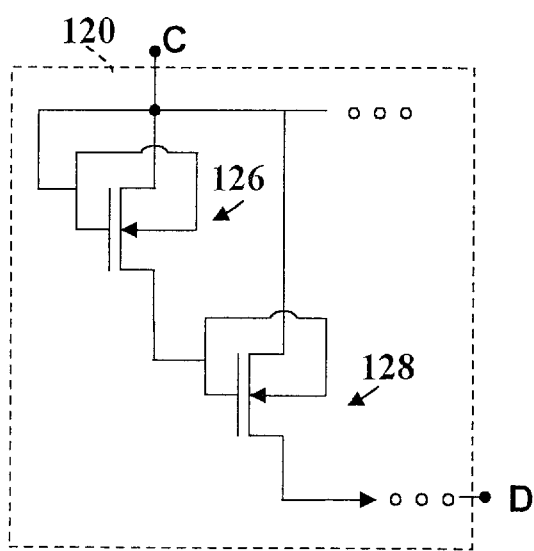

As seen in FIG. 28, the drain 34 of the BCG diode is tied to the body 38 and gate 32 through delay device 110 comprising level shifting device 120. The level shifting device 120 is used to delay the turn on of diode 40. Terminal A is normally connected to a signal pad (not shown), and terminal B is normally connected to the substrate or to ground. FIGS. 29 and 30 illustrate exemplary circuits used for level shifting device 120 between nodes C and D. FIG. 29 shows a string of BCG diodes constructed from SOI PFETs. As in all diode strings made reference to in this application, each string may consist of only one diode, or several diodes. The diodes turn each other on in sequential manner, thus allowing for a delay in the turn on of diode 40. In the FIG. 29 example, Node C connects to the source and drain of diode 122. The source and drain of each diode 122, 124 is tied together and the body connection of the first diode 122 is connected to the drain of the next diode 124. The body of the last diode connects to node D.

FIG. 30 shows a string of BCG diodes constructed from SOI NFETs. Node C connects to the drains of each of the diodes 126, 128 and the body connection of the first diode 126. The source of the first diode 126 is connected to the body/gate connection of the next diode 128. The source of the last diode connects to node D. Although BCG diodes are specifically shown for exemplary circuits of level shifting device 120, one of ordinary skill in the art will understand that other devices, such as lubistors, gated diodes, and other dynamic threshold (DT) MOSFETs, may be used in the diode string.

Figure 31:
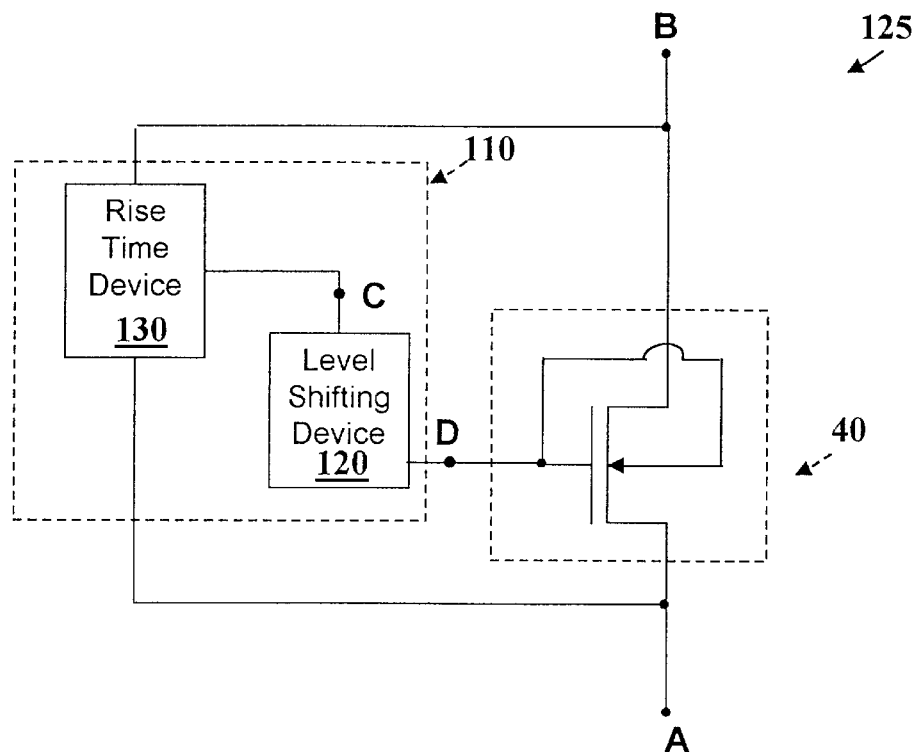
FIG. 31 illustrates a level-shifted body-coupled gated diode of FIG. 28 including a rise time network.

As shown in FIG. 31, delay device 110 comprises rise-time device 130 and level shifting device 120, rise time device 130 being connected to level shifting device 120 at node C. Rise-time device 130 also connects to terminals A and B and is generally a resistor/capacitor (RC)-coupled device. The drain of BCG diode 40 is now connected to the body/gate connection of BCG diode 40 through rise-time device 130 and level shifting device 120. The purpose of rise-time device 130 is to cause the body and gate of BCG diode 40 to rise, thus providing an earlier turn-on.

Figure 32:
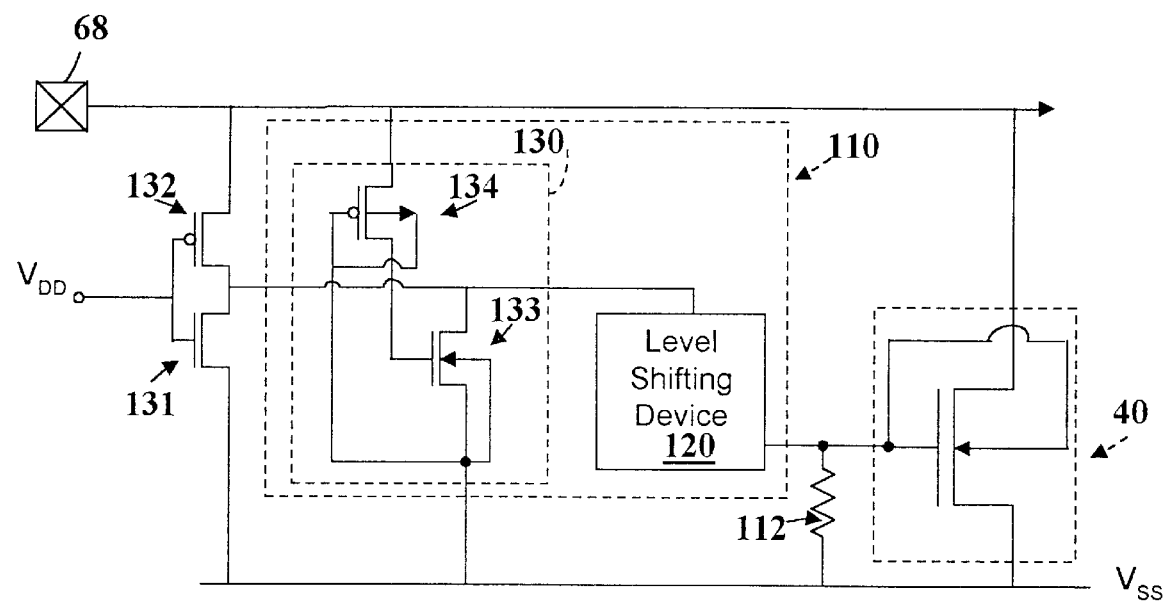
FIG. 32 illustrates an exemplary circuit of the device of FIG. 31 including an ESD clamp.

FIG. 32 depicts a specific exemplary RC circuit used for rise time device 130. The drain of a PFET BCG diode 134 is connected to the gate of an NFET 133. The body of transistor 133 is connected to the body/gate connection of the BCG diode and to terminal A, which in this case is Vss. A modulated ESD clamp, PFET 132 and NFET 131, uses rise-time device 130 to clamp voltage Vdd.

Thus, a diode formed from an SOI FET is disclosed in the invention that provides ideal diode characteristics at a first current region, and electrostatic discharge (ESD) protection at a second current region.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A silicon-on-insulator (SOI) field-effect transistor formed over an insulating layer comprising:
    a source for forming a first terminal of a gated diode fabricated over the insulating layer;
    a body;
    a gate, tied to said body; and
    a drain, coupled to said gate and said body, for forming a second terminal of said gated diode fabricated over the insulating layer,
    wherein said gated diode provides ideal analog characteristics at a first current level.

2. The transistor of claim 1, wherein said drain is connected to said gate and said body via a level shifting device.

3. The transistor of claim 1, wherein said transistor is a p-type transistor.

4. The circuit of claim 1, wherein said second terminal of said gated diode is coupled to a signal.

5. A silicon-on-insulator (SOI) field-effect transistor formed over an insulating layer comprising:
    a source for forming a first terminal of a gated diode fabricated over the insulating layer;
    a body;
    a gate, tied to said body; and
    a drain, coupled to said gate and said body, for forming a second terminal of said gated diode fabricated over the insulating layer,
    wherein said gated diode provides electrostatic discharge protection.

6. A silicon-on-insulator circuit receiving signals from a signal pad, comprising:
    at least one body-coupled gated diode, responsive to said signals, for providing electrostatic discharge protection from said signals by only generating voltages within a predetermined range of voltages.

7. The circuit of claim 6, further comprising:
    a mixed voltage circuit, connected to said at least one body-coupled gated diode, for providing a second voltage range for said generated voltages, wherein said at least one body-coupled gated diode forms a first stage of voltages and said mixed voltage circuit forms at least one higher stage of voltage.

8. The circuit of claim 7, wherein said at least one higher stage comprises serially-coupled diodes.

9. The circuit of claim 6 further comprising:
    a first body-coupled gated diode, connected to said signal and a predetermined high voltage, for clamping a voltage of said signal to said predetermined high voltage when said signal voltage is over said high voltage; and
    a second body-coupled gated diode, connected to said signal, a predetermined low voltage and said first diode, for clamping said signal voltage to said predetermined low voltage when said signal voltage is under said low voltage.

10. A silicon-on-insulator circuit receiving signals from a signal pad, comprising:
    at least one body-coupled gated diode, fabricated over an insulating layer, responsive to said signals, for providing electrostatic discharge protection from said signals by only generating voltages within a predetermined range of voltages.

11. The circuit of claim 10, wherein said field-effect transistor comprises a dynamic threshold at subthreshold levels, wherein said dynamic threshold correlates to a change in the body bias of said field-effect transistor.

12. The circuit of claim 10, wherein said field-effect transistor is a p-type transistor.

13. The circuit of claim 10, wherein said field-effect transistor is an n-type transistor.

14. A silicon-on-insulator circuit receiving signals from a signal pad, comprising:
    at least one body-coupled gated diode, fabricated over the insulating layer, responsive to said signals, for providing ideal diode characteristics to said circuit.

15. The circuit of claim 14, wherein said field-effect transistor is a p-type transistor.

16. The circuit of claim 14, wherein said field-effect transistor is an n-type transistor.

17. The circuit of claim 14 further comprising:
a resistor/capacitor device connected to said signal and said level shifting device.

18. The circuit of claim 14 wherein said level shifting device comprises serial-coupled diodes.

19. A method for protecting a silicon-on-insulator device from electrostatic discharge comprising the steps of:
a) providing a signal to said device through a silicon-on-insulator circuit; and
b) protecting said device from electrostatic discharge produced from said signal with at least one body-coupled gated diode of said circuit.

20. The method of claim 19, wherein providing said at least one body-coupled gated diode of step b) further comprises the steps of:
b1) providing a field-effect transistor fabricated over the insulating layer having a source, drain, body, and gate, said drain, body and gate being tied together;
b2) coupling a first terminal to said source of said field-effect transistor; and
b3) coupling a second terminal to said drain, which is connected to said body and said gate of said field-effect transistor.

21. The method of claim 20, further comprising the steps of:
b4) connecting a mixed voltage circuit to said at least one body-coupled gated diode, for providing a second voltage range for said generated voltages, wherein said at least one body-coupled gated diode forms a first stage of voltages and said mixed voltage circuit forms at least one higher stage of voltage.

22. The method of claim 21, wherein said at least one higher stage comprises serially-coupled diodes.

23. The method of claim 19, wherein providing said at least one body-coupled gated diode of step b) further comprises the steps of:
b1) providing a field-effect transistor having a source, drain, body, and gate, said gate and said body being tied together;
b2) connecting a level shifting device on a first side to said gate and said body node region of said field-effect transistor, and on a second side to said drain of said field-effect transistor;
b3) coupling a first terminal to said drain of said field-effect transistor; and
b4) coupling a second terminal to said source of said field-effect transistor.

24. The method of claim 23, wherein said field-effect transistor comprises a dynamic threshold at subthreshold levels, wherein said dynamic threshold correlates to a change in the body bias of said transistor.

25. The method of claim 23, wherein said field-effect transistor is a p-type transistor.

26. The method of claim 23, wherein said field-effect transistor is an n-type transistor.

27. The method of claim 23, further comprising the steps of:
b5) connecting a resistor/capacitor device to said signal and said level shifting device.

28. The method of claim 20 further comprising the steps of:
c) connecting a first body-coupled gated diode to said signal and a predetermined high voltage, for clamping a voltage of said signal to said predetermined high voltage when said signal voltage is over said high voltage; and
d) connecting a second body-coupled gated diode to said signal, a predetermined low voltage and said first diode, for clamping said signal voltage to said predetermined low voltage when said signal voltage is under said low voltage.

29. The method of claim 28, wherein step c) further comprises the steps of:
c1) coupling said first terminal of said first body-coupled gated diode to said predetermined high voltage;
c2) coupling said second terminal of said first body-coupled gated diode to said signal pad;
c3) coupling said first terminal of said second body-coupled gated diode to said signal pad; and
c4) coupling said second terminal of said second body-coupled gated diode to said predetermined low voltage.

* * * * *